(12) United States Patent
Bräysy et al.

(10) Patent No.: US 11,530,808 B1
(45) Date of Patent: Dec. 20, 2022

(54) INTEGRATED MULTILAYER STRUCTURE CONTAINING OPTICALLY FUNCTIONAL MODULE AND RELATED METHOD OF MANUFACTURE

(71) Applicant: TactoTek Oy, Oulunsalo (FI)

(72) Inventors: Vinski Bräysy, Oulunsalo (FI); Ilpo Hänninen, Oulunsalo (FI); Mikko Heikkinen, Oulunsalo (FI); Pälvi Apilo, Oulunsalo (FI); Jarmo Sääski, Oulunsalo (FI); Tomi Simula, Oulunsalo (FI); Topi Wuori, Oulunsalo (FI); Giovanni Ferri, Oulunsalo (FI); Pasi Korhonen, Oulunsalo (FI)

(73) Assignee: TACTOTEK OY, Oulunsalo (FI)

( * ) Notice: Subject to any disclaimer, the term of this patent is extended or adjusted under 35 U.S.C. 154(b) by 0 days.

(21) Appl. No.: 17/889,569

(22) Filed: Aug. 17, 2022

Related U.S. Application Data

(63) Continuation of application No. 17/704,329, filed on Mar. 25, 2022, now Pat. No. 11,460,185.

(51) Int. Cl.
*F21V 29/54* (2015.01)
*F21K 9/69* (2016.01)
(Continued)

(52) U.S. Cl.
CPC ........... *F21V 29/54* (2015.01); *F21K 9/69* (2016.08); *F21K 9/90* (2013.01); *F21V 23/06* (2013.01);
(Continued)

(58) Field of Classification Search
CPC ... F21K 9/90; F21K 9/69; F21V 23/06; F21V 29/767; F21V 29/87; F21V 29/503; F21V 29/508; F21Y 2115/10
See application file for complete search history.

(56) References Cited

U.S. PATENT DOCUMENTS 9,698,563 B2 7/2017 Palaniswamy et al.
10,485,094 B1 11/2019 Isohatala et al.
(Continued)

FOREIGN PATENT DOCUMENTS

KR 10-2016-0134026 * 11/2016 ............... F21K 9/20
WO 2016153168 A1 9/2016

OTHER PUBLICATIONS

Office Action issued by the USPTO in relation to U.S. Appl. No. 17/704,329 dated May 18, 2022 (13 pages).

*Primary Examiner* — Peggy A Neils
(74) *Attorney, Agent, or Firm* — Robert P. Michal, Esq.; Carter, DeLuca & Farrell LLP

(57) ABSTRACT

An integrated functional multilayer structure, includes a flexible preferably 3D-formable and thermoplastic, substrate film; a lighting module provided upon the substrate film and preferably electrically connected to the circuit design thereon, the lighting module having a circuit board for hosting electronics; and circuitry arranged on the circuit board including at least one light source; a thermoplastic layer including one or more thermoplastic materials molded upon the substrate film and at least laterally surrounding, optionally also at least partially covering, the lighting module; wherein the circuitry on the circuit board of the lighting module including the at least one light source is configured to electrically and thermally connect to a number of locations of the remaining structure beside or underneath the circuit board utilizing at least one connection material positioned in between, preferably at least at the periphery of the circuit board. A related method of manufacture is also presented.

30 Claims, 7 Drawing Sheets

(51) Int. Cl.
*F21V 29/87* (2015.01)
*F21V 29/76* (2015.01)
*F21V 23/06* (2006.01)
*F21K 9/90* (2016.01)
*F21Y 115/10* (2016.01)

(52) U.S. Cl.
CPC ............ *F21V 29/767* (2015.01); *F21V 29/87* (2015.01); *F21Y 2115/10* (2016.08)

(56) References Cited

U.S. PATENT DOCUMENTS

| | | |
|---|---|---|
| 10,883,700 B2 | 1/2021 | Okahisa et al. |
| 2009/0073713 A1 | 3/2009 | Glovatsky et al. |
| 2011/0315956 A1 | 12/2011 | Tischler et al. |
| 2014/0362597 A1 | 12/2014 | Verrat-Debailleul et al. |
| 2015/0276144 A1* | 10/2015 | Tudhope ................... F21V 5/10 29/832 |
| 2018/0343735 A1 | 11/2018 | Helbig et al. |
| 2019/0287892 A1 | 9/2019 | Saaski et al. |
| 2020/0229296 A1 | 7/2020 | Keranen et al. |

* cited by examiner

600

700

800

INTEGRATED MULTILAYER STRUCTURE CONTAINING OPTICALLY FUNCTIONAL MODULE AND RELATED METHOD OF MANUFACTURE

CROSS-REFERENCE TO RELATED APPLICATIONS

This application is a continuation of U.S. application Ser. No. 17/704,329 filed Mar. 25, 2022, the disclosure of this application is expressly incorporated herein by reference in its entirety.

FIELD OF THE INVENTION

The present invention relates in general to functional, integrated structures incorporating various functional features such as electronic, mechanical or optical elements. In particular, however not exclusively, the present invention concerns provision of such structures comprising a number of optoelectronic light sources.

BACKGROUND

There exists a variety of different stacked assemblies and multilayer structures in the context of different functional ensembles e.g. in the field of electronics and electronic products. The motivation behind the integration of functionalities involving e.g. electronics, mechanical or optical features may be as diverse as the related use contexts. Relatively often size savings, weight savings, cost savings, or just efficient integration of components is sought for when the resulting solution ultimately exhibits a multilayer nature. In turn, the associated use scenarios may relate to product packages or casings, visual design of device housings, wearable electronics, personal electronic devices, displays, detectors or sensors, vehicle interiors, antennae, labels, vehicle electronics, etc.

Electronics such as electronic components, ICs (integrated circuit), and conductors, may be generally provided onto a substrate element by a plurality of different techniques. For example, ready-made electronics such as various surface mount devices (SMD) may be mounted on a substrate surface that ultimately forms an inner or outer interface layer of a multilayer structure. Additionally, technologies falling under the term "printed electronics" may be applied to actually produce electronics directly and additively to the associated substrate. The term "printed" refers in this context to various printing techniques capable of producing electronics/electrical elements from the printed matter, including but not limited to screen printing, flexography, and inkjet printing, through a substantially additive printing process. The used substrates may be flexible, stretchable and printed materials organic, which is however, not always the case.

Furthermore, the concept of injection molded structural electronics (IMSE) involves building functional devices and parts therefor in the form of a multilayer structure, which encapsulates electronic functionality as seamlessly as possible. Characteristic to IMSE is also that the electronics is commonly manufactured into a true 3D (nonplanar) form in accordance with the 3D models of the overall target product, part or generally design. To achieve desired 3D layout of electronics on a 3D substrate and in the associated end product, the electronics may be still provided on an initially planar substrate, such as a film, using two dimensional (2D) methods of electronics assembly, whereupon the substrate, already accommodating the electronics, may be formed into a desired three-dimensional, i.e. 3D, shape and subjected to overmolding, for example, by suitable plastic material that covers and embeds the underlying elements such as electronics, thus protecting and potentially hiding the elements from the environment. Further layers and elements may be naturally added to the construction.

In connection with integrated structures packed with various optically functional features such as light sources, various challenges easily emerge and are advantageously addressed.

For example, undesired light bleed or light leakage out of a structure or between different internal volumes and areas thereof may easily cause both functional and aesthetic issues as being easily comprehended by a person skilled in the art.

Additionally, achieving high resolution control of internal and outcoupled light in terms of e.g. illuminated surface area shape, size, or location may at least occasionally turn out difficult with highly integrated structures. Achieving a wanted end result may require positioning the light sources sub-optimally close to desired exit or "outcoupling" surfaces of the light while being forced to stick with a rather limited number of orientations or types the light sources are typically made available, with reference to e.g. ordinary top- or side-shooting (-emitting) light-emitting diodes, i.e. LEDs.

In various solutions, controlling or specifically improving e.g., the uniformity of light over its outcoupling surface has been previously found burdensome. This may be an important issue when the surface contains an icon or symbol to be evenly lit to indicate to a viewer external to the structure that a device functionality or status associated with the icon or symbol is active, for example. Simply harnessing several light sources to more effectively lit up a joint target area or feature, such as an icon, may still cause illumination hot spots and leakage while also requiring more, often precious, power and space. Adding light guiding or processing elements into the structure has, in turn, its own drawbacks as already mentioned above.

Still, light sources such as e.g. high-power LEDs may consume somewhat remarkable power (easily in the order of magnitude of about 1 watt or more) and eventually end up so hot that they degrade or break. They may also damage adjacent heat-sensitive elements such as plastic substrates.

Still further, traditionally provision of optical elements such as lenses in various integrated structures has been a challenging task due to difficulties in accurate positioning and alignment of the elements relative to corresponding light sources or e.g., sensing features the elements should optically interact with. A minor shift from original specifications due to e.g. hard-to-estimate material compression and stretching during material processing such as molding or thermoforming, may ruin the applicability of the obtained integrated structure.

Still further, many light sources or related components such as driver circuitry cause high pitched noise, or generally EMI (electromagnetic interference), which may seriously disturb the function of other nearby elements such as capacitive sensing elements.

Still further, provision of interconnections between various subassemblies/components and hosting surfaces such as substrates have traditionally been problematic in terms of complex assembly, installation as well as element cracking, accidental detachment and other reliability issues.

SUMMARY

The objective of the present invention is to at least alleviate one or more of the drawbacks associated with the known solutions in the context of optically functional integrated structures and related methods of manufacture.

The objective is achieved with various embodiments of an integrated, functional multilayer structure and a related method of manufacture for providing the multilayer structure.

According to one aspect, an integrated functional multilayer structure comprises:

a flexible, preferably 3D-formable and thermoplastic, substrate film advantageously provided with a circuit design comprising at least a number of electrical conductors, such as traces and/or contact pads, further preferably at least partially if not fully additively printed thereon;

a lighting module provided upon the substrate film and preferably electrically connected to the circuit design thereon, said lighting module comprising:

a circuit board for hosting electronics; and circuitry arranged on the circuit board comprising at least one light source, optionally comprising at least one LED or other optoelectronic light source and further optionally a compatible driver circuit such as a LED driver;

a thermoplastic layer comprising one or more thermoplastic materials molded upon the substrate film and at least laterally surrounding, optionally also at least partially covering, the lighting module;

wherein the circuitry on the circuit board of the lighting module including the at least one light source is configured to electrically and thermally connect to a number of locations of the remaining structure beside or underneath the circuit board, optionally including electrical traces and/or thermal conductors provided on the substrate film, utilizing at least one connection material positioned in between, preferably at least at the periphery of the circuit board.

In a further aspect, a method for manufacturing an integrated functional multilayer structure, comprises:

obtaining a flexible, preferably 3D-formable and thermoplastic, substrate film and preferably providing it, optionally at least partially by printed electronics technology such as screen printing or ink jetting, with a circuit design comprising at least a number of electrical conductors, such as traces and/or contact pads;

arranging, optionally as at least partially if not essentially fully pre-fabricated subassembly, a lighting module upon the substrate film, said lighting module comprising:

a circuit board, such as a rigid fiberglass-reinforced epoxy-laminated circuit board or a metal core circuit board, for hosting electronics; and circuitry on the circuit board comprising at least one light source, optionally comprising at least one LED;

wherein the circuitry is configured to electrically and thermally connect to a number of locations of the remaining structure beside or underneath the circuit board, optionally including electrical traces and/or thermal conductors provided on or adjacent the substrate film, utilizing at least one connection material positioned in between;

and producing, preferably through molding such as injection molding, a thermoplastic layer on the substrate film so as to at least laterally surround, optionally also at least partially cover, the lighting module.

The present invention provides different advantages over a great variety of previously applied solutions, naturally depending on each particular embodiment thereof.

For instance, thermal management such as thermal dissipation, or heat dissipation, between heat generating circuitry such as high-power LEDs included in the structure and the remaining structure potentially including particular thermal conductors and heat transfer elements may be considerably improved by the use of a circuit board-containing lighting module for hosting the circuitry and arranged thermal connections, for which there are many options deliberated hereinafter in more detail, between the circuitry and a number of locations of the remaining structure. Heat can be transferred and distributed effectively away from their generation points to avoid excessive hot spots that might damage besides adjacent elements such as the underlying substrate film also the heat sources such as LEDs or other circuitry themselves. Optimum heat transfer mechanisms naturally depend on the particular embodiment in question but generally include especially conduction and in some embodiments also e.g., convection or radiation.

Yet, by the suggested proper configuration such as feasible dimensions, shape, materials and element positioning of the circuit board of the lighting module, many previously annoying assembly, installation, reliability and interconnection issues regarding the related circuitry, potential other elements such as optical elements and the remaining (external) structure may be overcome or at least reduced.

The circuit board may generally have a rounded or essentially circular planar shape with castellated edges enabling convenient pad connection at the edges with the substrate film and elements thereon. Round shapes work well with overmolding while reducing also related need for e.g. mold flow simulations, and there are no requirements to assemble the part in or to some specific orientation. However, angular shapes such as rectangular shapes could be still alternatively used. As there does not have to be e.g., pads underneath the module, the module can be assembled or provided directly onto the film and often there is no need for underfill or extra protective layers, e.g. against heat or mechanical damage, such as ink layers between the substrate film and the module. Accordingly, as the circuit board may be firmly adhered directly to the substrate film, the board may be kept thin when desired (e.g. 0.2-0.6 mm thickness may be applicable). Thermal path to the remaining structure is minimized. Different cross-overs and passives may be done within the module. The module may be assembled without using e.g., any trench in a mold therefor. Achievable bonding is still strong, which may allow placing the circuit board and the whole module even directly under an injection molding gate or on or adjacent areas that are 3D shaped optionally by thermoforming. Resulting from all this, the number of necessary manufacturing phases is kept low, process speed high, and the resulting structure somewhat simple while effective and versatile when needed.

Having regard to electromagnetic disturbances commonly caused by e.g. electronic components such as LEDs, various embodiments of the present invention provide a solution by enclosing such EMI-causing components at least partially within an electrically conductive shield structure for blocking the associated electromagnetic fields. The structure may also be called as a Faraday cage. The shield structure may be cleverly implemented as integral or jointly with the lighting module. Separated ground, power and signal layers add to the EMI avoidance. The associated ground plane may be arranged to the circuit board and there may be connected, electrically conductive and preferably also optically reflective transverse walls on the sides. The used material may advantageously thus be both electrically conductive and optically reflective. The suggested type of an enclosure may be additionally or alternatively utilized to protect various EMI sensitive components such capacitive sensing elements such as drivers or different radio parts, for instance.

In various embodiments also light outcoupling from the structure may be improved in terms of accuracy, uniformity and intensity, for example, while undesired light leakage outside the structure or desired internal optical path is reduced. Besides through the usage of a suitable lightguide material such as translucent resin e.g. as the thermoplastic overmolding material, by the introduction of a sidewall structure in the lighting module, related internal cavity, lens or (micro)lens array, reflector, diffuser and tilted surface optionally arranged by a specific carrier element, light emitted by the included light sources may be effectively, reliably and accurately controlled and overall optical performance of the solution enhanced e.g., in the aforementioned respects. Yield of the associated manufacturing processes remains good or is elevated. The options listed above have clear synergetic effects while they may also be used selectively in each embodiment depending on the details of each particular use scenario and related constraints and requirements. Different embodiments of the present invention suit a great variety of illumination solutions including e.g. high intensity spotlight applications, surface or graphics illumination applications, backlighting, UI (user interface) lighting, ambient lighting, interior such as vehicle or specifically car interior lighting, etc.

With reference to the above, the used light sources may indeed be provided with carrier elements that enable orientating the sources as desired, thus offering a possibility to adjust their emission directions and resulting outcoupling areas in terms of their position and size, for example, rather flexibly. For instance, a top-shooting (top-emitting) light source may be tilted such that its beam is laterally shifted from directly above the light source towards the side(s). As many of feasible thermoplastic materials, such as materials used for lightguides, have a lowish injection molding temperature, use of e.g., IMSE technology may be made more reliable and yield improved in contrast to materials requiring high molding temperatures easily negatively affecting the functionality and condition of features already existing on substrate films or other elements subjected to such temperatures.

The selected thermoplastic overmolding material and/or other material(s) included in the structure, optionally specifically in the module, and used e.g., as lightguides may be selected essentially transparent or translucent (i.e. scattering/diffusive as multiple scattering can be deemed diffusion) so that the illumination effect obtained by an embedded light source e.g., on a selected target surface of the structure, e.g. exterior surface, which may contain e.g. an icon or other graphical element to be illuminated by the outcoupled light, is uniform without obvious hot spots or dark areas, while still avoiding noticeable or at least excessive light leakage to adjacent areas, which may be optionally associated with different light source(s) and target features such as icons to be illuminated separately.

Generally, in various embodiments a selected optically attenuating (scattering (diffusive) and/or absorbing) translucent and potentially tinted or more strongly colored material such as thermoplastic resin, may be utilized as the light carrier, or "lightguide", material to control light propagation and limit it to desired areas and distances while avoiding substantial leakage to non-desired areas called light leakage prohibition regions. Accordingly, different surfaces, icons, symbols, shapes, other features and structures may be effectively and controllably illuminated while not exposing non-target areas, even close or adjacent ones, to similar lighting. This facilitates providing highly integrated smaller size structures wherein different features can be located close to each other without causing mutual issues such as light leakage or electromagnetic disturbance due to their shortish distance.

The color, translucency, diffusion and generally optical attenuation properties of the used material(s), such as the thermoplastic material(s), may be configured by mixing additives such as a selected masterbatch or pigment based color additive therein, for instance. Yet, the material(s) of the thermoplastic layer or further layer(s) may locally vary even within the very same integral or even monolithic layer or piece in terms of associated characteristics such as attenuation or particularly diffusion, obtained by varying the material properties such as a mixing ratio during manufacturing or application thereof.

Various embodiments of the present invention may further enable providing, by clever joint configuration of the used materials, light sources, and e.g. their mutual positioning, orientation as well as dimensions, a so-called "hidden until lit" effect e.g., in the IMSE structures. Graphical symbols provided in the structure, various components, or e.g., conductive traces can be obscured from external visual perception until a light source intended and targeted to illuminate them is activated. With such embodiments of the present invention, it is possible to have decorative surface prints on the outcoupling areas and e.g. on associated film(s) (not just openings), and by embedding features to be normally masked from easy external visual perception e.g., several millimeters deep in the lightguide material, related optical aspects are much more convenient to control than with very shallow layers. The suggested solution is also time and cost saving process-wise.

Various other advantages different embodiments of the present invention may offer will become clear to a skilled person based on the following more detailed description.

The expression "a number of" may herein refer to any positive integer starting from one (1).

The expression "a plurality of" may refer to any positive integer starting from two (2), respectively.

The terms "first" and "second" are herein used to distinguish one element from other element(s), and not to specially prioritize or order them, if not otherwise explicitly stated.

The exemplary embodiments of the present invention presented herein are not to be interpreted to pose limitations to the applicability of the appended claims. The verb "to comprise" is used herein as an open limitation that does not exclude the existence of also un-recited features. The features recited in various embodiments and e.g. dependent claims are mutually freely combinable unless otherwise explicitly stated.

The novel features that are considered as characteristic of the present invention are set forth in particular in the appended claims. The present invention itself, however, both as to its construction and its method of operation, together with additional objectives and advantages thereof, will be best understood from the following description of a number of specific embodiments when read in connection with the accompanying drawings.

BRIEF DESCRIPTION OF FIGURES

Selected embodiments of the invention are illustrated by way of example, and not by way of limitation, in the figures of the accompanying drawings.

DETAILED DESCRIPTION OF SOME EMBODIMENTS

Figure 1:
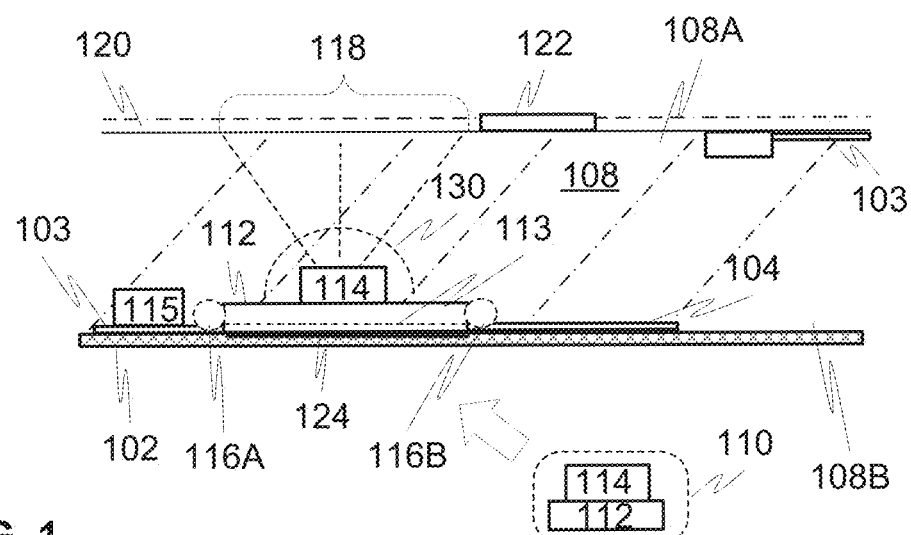
FIG. 1 illustrates various aspects of the present invention via an embodiment of a multilayer structure in accordance therewith.

FIG. 1 illustrates, at 100, an embodiment of a multilayer structure in accordance with the present invention.

The multilayer structure includes at least one substrate film 102, which is preferably of flexible and 3D-formable (3D-shapeable) material, such as thermoformable (plastic) material. As being easily comprehended by a person skilled in the art, instead of a single, optionally monolithic film 102, the substrate film 102 could be of a multilayer and/or multi-section construction with mutually different layers at least in places, for instance.

Item 108 refers to at least one thermoplastic, functionally lightguide establishing, layer preferably provided by molding it upon the substrate film 102 and optionally essentially between the substrate film 102 and element 120, which may be another (substrate) film either different from or similar to the film 102, for example.

The lightguide layer 108 comprises a first side and a related first surface 108A that is advantageously targeted towards the use environment of the structure and e.g., a user of the structure, or a device containing the structure, therein. Yet, the substrate film 102 comprises an opposite second side and associated second surface 108B essentially facing the structure internals or a host device, for instance.

As alluded to hereinbefore, item 120 may refer to at least one further film, coating, or other functional element. In many embodiments, there may be multiple of such at least locally stacked upon the surface 108A.

The substrate film 102 and/or further film(s) 120 or generally material layer(s) included in the multilayer structure may comprise at least one material selected from the group consisting of: polymer, thermoplastic material, electrically insulating material, PMMA (Polymethyl methacrylate), Poly Carbonate (PC), flame retardant (FR) PC film, FR700 type PC, copolyester, copolyester resin, polyimide, a copolymer of Methyl Methacrylate and Styrene (MS resin), glass, Polyethylene Terephthalate (PET), carbon fiber, organic material, biomaterial, leather, wood, textile, fabric, metal, organic natural material, solid wood, veneer, plywood, bark, tree bark, birch bark, cork, natural leather, natural textile or fabric material, naturally grown material, cotton, wool, linen, silk, and any combination of the above.

The thickness of the film 102 and optionally of further film(s) or layer(s) 120 may vary depending on the embodiment; it may only be of few tens or hundreds of a millimeter, or considerably thicker, in the magnitude of one or few millimeter(s), for example.

The thickness of the thermoplastic layer 108 may also be selected case-specifically but thicknesses of few millimeters, such as about 3-5 millimeters, may be applied. In some embodiments, only about 2 millimeter thickness could be sufficient if not optimum, while in some other embodiments the thickness could be considerably more as well, e.g. about 1 cm or more at least in places. The thickness may indeed locally vary. The thermoplastic layer 108 may optionally comprise recesses or internal cavities for light guiding, processing, and/or thermal management purposes, for instance, in addition to accommodating various elements such as electronic or optical elements.

Item 110 refers to a lighting module provided upon the substrate film 102 and preferably electrically connected to the circuit design thereon. The lighting module 110 comprises at least a circuit board 112 for hosting electronics and circuitry 114 arranged on the circuit board comprising at least one light source, optionally comprising at least one LED such as a high-power LED. The circuitry 114 on the board 112 will preferably also include a circuit design with e.g. conductive traces or pads for connecting components such as light sources with other components or elements, e.g. control or communication circuit, in a desired fashion at least locally on the board 112.

The wattage of one or more light sources of the at least one light source and/or of some other high-power component included may be about 1 W or more, even significantly more, for example. Optionally, there may be a plurality of light sources of mutually similar or different characteristics (wavelength/color, power, emission direction, beam width, technology, etc.) on the board 112. An included light source such as a LED may be preferably independently adjusted e.g., in terms of its emission intensity via compatible control and driver circuit preferably at least partially included in the same multilayer structure and more preferably in the same module 110, utilizing e.g. PWM (pulse width modulation) or current control for the purpose.

Item 103 refers to the circuit design in the form of a number of electrical, optionally additively printed such as screen printed, conductors such as traces, which may optionally further act as thermal conductors. They 103 may be used for power and data transfer purposes, for example, between the elements of the structure 100 and/or with external elements. Item 104 refers to a number of thermal conductors such as thermal traces. Preferably, they may be at least partially provided as the electrical conductors, with reference to printing and other applicable methods. Likewise, the thermal conductors 104 may optionally be also electrically conductive.

There may be circuitry going beyond the circuit design of conductive traces or pads 103, such as various components 115, e.g. light source(s) or other electronic or specifically optoelectronic components, also outside the module 110. This circuitry could be provided upon any of film(s) 102, 120 and/or other layers, potentially still at least partially embedded in the thermoplastic layer 108. Indeed, in case the structure contains e.g. a further film 120, it 120 could be provided with circuitry including e.g., light source(s) or sensor(s) as well, and be optionally electrically or electromagnetically connected to the electronics such as traces and components on the film 102 via intermediate wiring or wirelessly through capacitive or inductive coupling, for instance.

In the shown case, the (first) light source is emissive as indicated by the dotted lines extending from the source 104 to a target outcoupling area 118 on the layer 108. It 104 may be e.g., a top-shooting LED.

Generally in various embodiments of the present invention, the used light source(s) included e.g. in circuitry 114 could be any of top-emitting, side-emitting, dual side emitting, and bottom emitting light source(s) such as LEDs, for example. Using e.g. a side-emitting light source, the outcoupling area 118 may be conveniently laterally shifted from the area right above the light source 104 on the surface 108A.

A packaged semiconductor type or a chip-on-board semiconductor type light source, preferably LED, may be used. Still packaging-wise, the light source could be optionally of flip-chip type. In some embodiments, the light source may contain multiple (two, three, four, or more) light-emission units such as LEDs packaged or at least grouped together. For example, a multi-color or specifically RGB LED of several LED emitters could be provided within a single package.

In preferred embodiments, the optical transmittance of e.g., translucent material selected for the thermoplastic layer 108 may be between about 25% and about 90%, or more, at selected wavelengths such as at least part of the visible wavelengths, considering e.g., about 2 mm or 3 mm thick sample of the material. The associated half power angle can be between about 5 and about 75 degrees (intensity based), such as about 5, 10, 20, 30, 40, 50, 60, or 70 degrees. In different use scenarios, desired transmittance and scattering characteristics may naturally still vary.

Accordingly, the thermoplastic layer 108 may comprise optically at least translucent, optionally substantially transparent, material, wherein the optical transmittance of the overall thermoplastic layer may in some use scenarios preferably be at least 50%, but the desired transmittance may indeed radically differ between all possible use scenarios. In some embodiments at least about 80% or 90% transmittance could be preferred for maximizing the light output from the structure, while in some others 10%, 20% or 30% could be quite sufficient if not even advantageous, if e.g. light leakage related issues are to be minimized. The transmittance may be measured or defined in a selected direction, e.g. main direction of light propagation and/or in a transverse direction to the surface of the substrate film at the position of the lighting module on the substrate film, having regard to selected wavelengths, optionally including visible wavelengths, of the light emitted by the at least one light source.

Suitable translucency and attenuation of the thermoplastic layer 108 may be reached by employing scattering elements in the lightguide material, for example. When the amount of scattering elements is increased, scattering/diffusion and half power angle, as one possible measurable indicator, are increased as well while luminous transmission through the layer will generally decrease. Correspondingly, increasing layer thickness generally increases scattering/diffusion properties such as the half power angle and decreases transmission.

While considering e.g. the scattering/diffusion or other optical properties as discussed above, the thermoplastic layer 108 may generally comprise, for example, at least one material selected from the group consisting of: polymer, organic material, biomaterial, composite material, thermoplastic material, thermosetting material, elastomeric resin, PC, PMMA, ABS, PET, copolyester, copolyester resin, nylon (PA, polyamide), PP (polypropylene), TPU (thermoplastic polyurethane), polystyrene (GPPS), TPSiV (thermoplastic silicone vulcanizate), and MS resin.

One example of a polycarbonate based applicable material is Makrolon™ available in a variety of grades, exhibiting different colors/tinting (e.g. white/whitish and black/blackish or dark), transparencies and scattering characteristics, for example.

As discussed above, tinted or more strongly colored resin may provide a feasible option for the thermoplastic layer 108 to limit undesired light leakage within and outside the structure 100 to close elements or generally distances, and hide the internals such as light source 104 or other circuitry from external perception. Originally optically substantially clear base material such as PC or other plastic resin may be doped with a colored masterbatch. In many use scenarios wherein the structure 100 should be only e.g., few millimeters or a centimeter thick in total, whereupon the thermoplastic layer 108 should be even thinner, using about 2-4 mm, such as 3 mm, thick layer of plastic resin provided with a selected masterbatch (e.g. white or desired selective wavelength resin, optionally also e.g. IR (infrared) resin that might find use e.g., IR remote control applications) in a desired concentration (e.g. let-down ratio of about 1%) for establishing the lightguide layer 108, may provide quite satisfying results. Generally, in many embodiments in the context of the present invention, a feasible let-down (dosing or doping) ratio is indeed about 5%, 4%, 3%, 2%, 1% or less. For example, suitable industrial grade masterbatches for the purpose are provided by Lifocolor™.

The afore-discussed "hidden until lit" effect may be achieved, for instance, by adding translucent, e.g. a selected color exhibiting, masterbatch in the injection molded base resin constituting the lightguide layer 108. Yet, the used substrate film 102 may be opaque, black and/or otherwise exhibitive of dark colour. Accordingly, it is possible to provide "invisible until lit icons" on the surface 108A, with reference to e.g., printed elements 122, clear or translucent film 120 with printed icons, and/or an opaque/dark/color film arranged with one or more openings among other options. Using e.g. about 3% of translucent, preferably black color masterbatch may be sufficient to visually hide underlying modules 110, components 115, traces 103, and/or other elements from external perception. The embedded underlying elements such as components and traces may be additionally prepared from dark color—providing, preferably optically highly attenuating or absorbing materials. Alternatively, transparent materials could be utilized. Different illumination effects may be achieved with different colors. The translucent material of the layer 108 may be generally or selectively matched to the color(s) used on the surface 108A, such as the color(s) exhibited by the inks or films thereat.

As mentioned above, using essentially white color exhibiting resin as the layer 108 and with a suitable configuration of multi-color light sources such as RGB-LEDs embedded, basically any color may be lit upon need on the (white) surface 108A.

Item 130 refers to optional encapsulant, glob top or other conformal coating, such as a Illumabond™ or Triggerbond™ for light shaping or other processing, protecting and/or securing purposes, for instance. The used substance may be dispensed on top of selected circuitry 114 such as the light source. It may be substantially clear (transparent), for example. Alternatively, it could be colored and/or translucent. In some embodiments, a specific optical function or feature such as a lens may be provided by the encapsulant. The lens could be diffusive, Fresnel or e.g. collimating, for example. Additionally or alternatively, a pre-made lens or generally optical component is possible to include in the structure as well. Various potential lens implementations are discussed also hereinlater.

As briefly alluded to above, item 122 may refer to at least one functional element that may have been attached and/or additively in-situ produced such as printed (e.g., screen printed, inkjetted, or 3D printed) on the first surface 108A of the thermoplastic layer 108, optionally positioned adjacent and/or upon the outcoupling area 118. In case there is also e.g., a film 120 on the surface 108A, a functional element 122 could have been provided on any side thereof, i.e. the side facing the layer 108 or the opposite side thus facing the environment. On the side facing the layer 108 it 122 would be better protected from the environment.

The functional element(s) 122 may be selected from the group consisting of: light blocking (masking) element, graphical element (e.g., icon, symbol, pattern, alphanumeric element, picture, etc., which may have an indicative nature such as status indicator of a hosting or connected device), optical diffuser, reflector, dispersive element, and collimator. Optically the functional element(s) 122 as well as e.g., film(s) 102, 120 may be transparent, translucent or opaque, with reference to e.g. color prints or layers. Yet, the item 122 may refer, for example, an electrically and/or thermally conductive trace, electrode, electrical insulator, electronic component, circuit element, or a connector.

In some embodiments, the functional element(s) 122 could be monolithic with the layer 108 as discussed hereinelsewhere.

Thus the functional element(s) 122 may have, among other options, indicative, optical, connecting, thermal, and/or electrical (conductive, insulating, sensing or other) function, for instance.

Based on the foregoing, it may be thus said that in this and various other embodiments of the multilayer structure and module 110, at least one cover element, optionally including at least one further film and/or printed element, 120, 122 on a side 108A of the thermoplastic layer opposite to the side 108B facing the circuit board, may be provided. The at least one cover element may host or define one or more target elements 118, 118B, optionally comprising symbols, icons, textures, 3D surfaces, or surface (sub-)areas, to be illuminated by the at least one light source of circuitry 114 and/or 115.

As already alluded to above, the element(s) 122 may be positioned e.g., adjacent the outcoupling area 112 or partially or fully overlapping therewith. The light source(s) included in circuitry 114 may be configured to illuminate the element(s) 122 such as graphical elements in a way that they stand out visually to a user in the environment of the structure 100. Further light sources potentially included in the structure 100 may have a similar function in terms of outcoupling areas/functional elements associated therewith (which may differ or be the same as with the first source 104) as already discussed hereinbefore. In some embodiments, a plurality of light sources included may be configured to jointly establish an illuminated element, such as a figure, pattern, symbol, icon, or animation, optionally with one or more elements 120, 122 and/or (selected features of) thermoplastic layer 108 for external perception.

The circuitry 103, 114, 115 included in the structure 100 (e.g., in the module 110 or elsewhere), besides a number of light source(s) and e.g. related drivers, may comprise e.g., the aforementioned electrically conductive traces 103 or contact pads optionally printed on the film 102 and/or other material layers of the structure 100 using printed electronics technology. The traces may be configured for power and/or data (e.g. signaling data or other data) transfer between elements such as a light source and related driver, or generally a controller and/or power source, for example. Yet, the circuitry may comprise one or more electrodes, electrical connectors, electronic components and/or integrated circuits (IC), such as control circuits or data transfer circuits. Such circuitry may be directly produced in or for the structure 100 by selected method(s) such as a selected printed electronics technology, optionally screen printing, or using a selected coating technique, for instance. Additionally or alternatively, the circuitry may include a number of mounted components such as surface-mounted devices (SMD). Accordingly, nonconductive and/or conductive adhesive may be utilized for securing the components on the carrier. In some embodiments, mechanical securing is implemented or at least enhanced by nonconductive adhesive material whereas solder or other electrically highly conductive (but to lesser extend, adhesive type of) material is used for electrical connection.

If optionally capacitive sensing of e.g., touch or touchless gestures upon the structure 100 is to be implemented, sensing electrodes of the circuitry may be configured (dimensioned, positioned, etc.) so that their sensing area or volume defined by e.g., the associated electric or electromagnetic field is located as desired and thereby covers e.g. the area upon selected side walls and/or top of the structure, and/or other regions that should be made sensitive to touch (and/or touchless gestures in some embodiments) or other sensing target. This type of configuring may be achieved or performed through the utilization of necessary simulation or measurements, for instance.

Still, the circuitry may comprise and/or the remaining multilayer structure may comprise at least one component or element selected from the group consisting of: electronic component, electromechanical component, electro-optical component, radiation-emitting component, light-emitting component, LED (light-emitting diode), OLED (organic LED), side-shooting LED or other light source, top-shooting LED or other light source, bottom-shooting LED or other light source, radiation detecting component, light-detecting or light-sensitive component, photodiode, phototransistor, photovoltaic device, sensor, micromechanical component, switch, touch switch, touch panel, proximity switch, touch sensor, atmospheric sensor, temperature sensor, pressure sensor, moisture sensor, gas sensor, proximity sensor, capacitive switch, capacitive sensor, projected capacitive sensor or switch, single-electrode capacitive switch or sensor, capacitive button, multi-electrode capacitive switch or sensor, self-capacitance sensor, mutual capacitive sensor, inductive sensor, sensor electrode, micromechanical component, UI element, user input element, vibration element, sound producing element, communication element, transmitter, receiver, transceiver, antenna, infrared (IR) receiver or transmitter, wireless communication element, wireless tag, radio tag, tag reader, data processing element, microprocessor, microcontroller, digital signal processor, signal processor, programmable logic chip, ASIC (application-specific integrated circuit), data storage element, and electronic sub-assembly.

The structure 100 may be and in many use scenarios will be connected to an external system or device such as a host device or host arrangement of the structure, wherein the connection may be implemented by a connector, e.g. electrical connector, or connector cable, which may be attached to the structure 100 and its elements such as circuitry in a selected fashion, e.g. communications and/or power supply wise. The attachment point may be on a side or bottom of the structure, provided e.g., via a through-hole in the film 102. These aspects are discussed further also hereinafter.

Item 124 refers to fixing element or material such as structural adhesive that may be disposed between the substrate film 102 and the circuit board 112 to enable securing the board 112 and therefore the module 110 containing board 110.

Item 116A refers to electrical connection material, i.e. at least electrically conductive material, which may optionally also be thermally conductive.

Item 116B refers to thermal connection material, i.e. at least thermally conductive material, which may optionally also be electrically conductive.

Electrical and thermal connection points and/or routes may be the same or mutually different at the structure 100, e.g., between the module 110 (circuit board 112, circuitry 114) and the remaining structure (e.g. traces 103 of the circuit design, thermal conductors 104, various other circuitry 115, heat transfer elements, etc.) and/or locally e.g. within the module 110, or on the film 102.

Commonly, the used material 116A, 116B may be conductive both thermally and electrically, whereupon depending on the particular use case, a person skilled in the art may determine whether e.g. a dominantly electrically conductive material with lower thermal conductivity still suffices as a thermal connection material, or vice versa, or should different materials or composite materials be used for obtaining desired conductivity in both respects.

Accordingly, one or more connection materials may be used to provide the desired electrical and thermal connections between the module 110 and the remaining structure such as circuit design/circuitry 103, 115 on the film 102 or elsewhere, thermal conductor(s) 104 and/or e.g. potential further heat transfer element(s) discussed hereinafter e.g. with reference to FIGS. 6-8.

The at least one connection material 116A, 116B thus advantageously comprises at least one material selected from the group consisting of:
electrically and thermally conductive material such as ink or adhesive;
thermally conductive electrically insulating material such as adhesive; and
electrically conductive thermally insulating material.

At least thermally conductive connection material, circuit board and/or a heat transfer element connected to the circuit board may preferably have, still depending on the embodiment and at least locally if not generally, a thermal conductance of at least about 1 W/mK, more preferably at least about 10 W/mK, and most preferably at least about 100 W/mK.

Electrical conductivity of materials included in the structure due to their good electrical conductivity or correspondingly, low electrical resistance, considering e.g. at least electrically conductive connection material or generally various other elements to be used at least as electrical conductors such as traces, pads or electrodes, may vary depending on the embodiment. When defined in terms of sheet resistivity, the sheet resistivity of the used material may at least locally, if not generally, be e.g., about 350 mΩ/sq/mil or less, more preferably about 100 mΩ/sq/mil or less and most preferably about 35 mΩ/sq/mil or less on a substrate material such as a polycarbonate film. One practical example of industrial grade suitable material is e.g., Dupont™ ME602 or ME603 silver conductor, which is also stretchable and therefore suits applications requiring 3D shaping by thermoforming well.

The at least one connection material 116A, 116B may define an angular or curved element directed e.g., over an edge of the circuit board 112 ("edge connector"). Alternatively or additionally, the connection material 116A, 116B, or the connection element created therefrom, may in some embodiments proceed through the circuit board 112 via a through-hole therein, for example. The element may generally also be straight (e.g. bar or pipe-like) or exhibit a dome, ball, blob or other shape depending on e.g. provision method thereof, such as dispensing. For instance, shapes reminding of letters L, U, I or O are possible. In some embodiments, any of connection elements created by the connection material 116A, 116B could be formed at least partially integrally with some other element of the multilayer structure such as board 112, circuitry 114, conductor 103, 104, or castellation 212.

Figure 2:
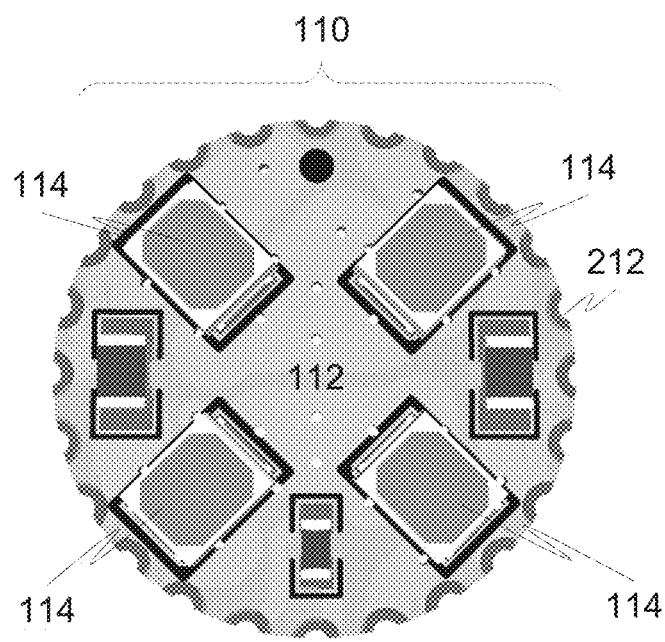
FIG. 2 illustrates an embodiment of a lighting module comprising a circuit board provided with circuitry in accordance with the present invention.

FIG. 2 illustrates at 200, via a top or plane view, an embodiment of a lighting module 110 comprising a circuit board 112 provided with circuitry 114 in accordance with the present invention.

The circuit board 112 may comprise at least one element selected from the group consisting of: a flexible film or sheet, a rigid sheet, rectangular sheet or film, rounded or essentially circular sheet or film, FR4 based circuit board, metal core circuit board, plastic substrate, molded such as injection molded plastic substrate, metal substrate such as sheet metal substrate optionally having an electrically insulated layer at least selectively provided thereon, and a ceramic circuit board.

As discussed also hereinbefore, the circuit board 112 or e.g., the substrate film 102 may host various electrical and/or other elements, such as series resistor, thermistor, white solder mask, trace, antenna, sensor, electrode such as a capacitive sensing electrode, contact pad, integrated circuit, controller, processor, memory, transceiver, driver circuit, optionally optically clear glob top or other conformal coating, and via such as electrical, fluidic and/or thermal via.

Series resistors may be used to even out undesired resistance fluctuation arising from printed electronics, for example. A thermistor may turn out useful in preventing overheating situations, which might damage different components and materials such as thermoplastic layer 108. White soldermask may be utilized to improve the reflectivity of the associated surface. Yet, exposed conductive area with immersion silver or gold surface finish may be utilized. For example, gold is excellent reflector for IR applications, whereas silver works well for visible light. Exposed copper could be used e.g., at the bottom for enhancing adhesion and thermal conductivity. Vias may be beneficial in a number of ways depending on their configuration, with reference to creating thermal bridges for thermal (heat) dissipation purposes, reducing the amount of trapped air under the concerned element during injection molding, for instance, and enhancing the adherence of the concerned element to a carrier surface such as the substrate film 102. Capacitors (or inductors) may be utilized e.g. for current control purposes such as fluctuation control.

The circuit board 112 preferably comprises a number of castellations 212. Plated half-holes or plated edges are feasible options among others. The number of desired castellations may vary case-specifically from a few to several tens, for example. A number of extra castellations may be provided for redundancy to meet e.g., safety compliance or failure rate requirements. The diameter of a castellated hole may be about 1 mm or less, for instance. The castellations 212 may be then provided with the at least one connection material 116A, 116B such as electrically/thermally conductive adhesive or ink. Accordingly, the castellations or castellated holes 212 may be configured to provide both electrical and thermal connectivity having regard to the board 112 and module 110 general vs the remaining structure.

Generally, the circuit board 112 may be planar and preferably round if not essentially circular or elliptical by its general shape. The dimensions, shapes and thickness of the circuit may vary depending on the use case. Therefore, e.g. rectangular shape is possible as well. Thickness may be a fraction or portion of a millimeter (e.g. between about 0.2 and about 0.6 mm), a millimeter, few millimeters, or more, for example. Yet, the diameter may be few millimeters, about one centimetre, or few centimeters among other options.

To avoid e.g. CTE (coefficient of thermal expansion) related issues such as cracking, it may be useful to maintain the board 112 a bit smaller or moderate in terms of its size, and increase other thermal dissipation area/volume in the structure by providing thermal elements such as prints therein, for example. Yet, a thicker board 112 may facilitate providing the hosted circuitry 114 and/or other elements, such as optics or touch sensors, closer to the surface 108A, which may improve light outcoupling among other potential benefits, while a thinner board 112 may improve at least heat dissipation to the elements underneath.

As discussed also hereinelsewhere, the circuitry 114 on the circuit board 112 may be configured to electrically and thermally connect to a number of locations of the remaining multilayer structure e.g., beside or underneath the circuit board 112, utilizing at least one connection material 116A, 116B positioned in between, preferably at least at the periphery of the circuit board 112 (if present) and optionally through it.

As already contemplated hereinbefore, the use of the circuit board 112 may facilitate besides various assembly related issues also thermal management in connection with heat generating elements such as high power light sources, optionally high power LEDs. Damaging the substrate film 102 by excessive heat build-up by the electronics may be then avoided or at least reduced among other benefits; the circuit board 112 could itself act as a heat sink among other features potentially included in the structure 100 for the same purpose.

Figure 3:
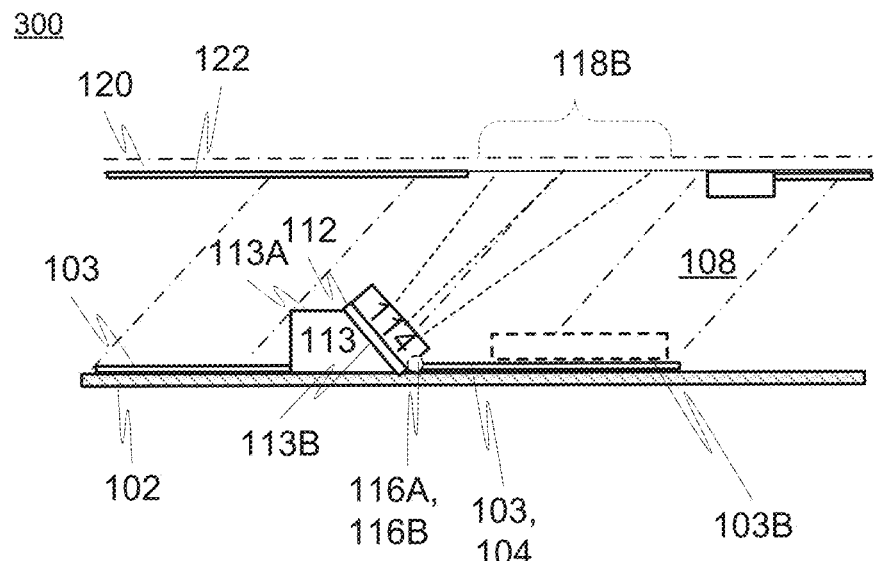
FIG. 3 illustrates an embodiment of a carrier element usable in connection with the present invention.

FIG. 3 illustrates an embodiment of a carrier element usable in connection with the present invention.

However, prior to discussing the details of FIG. 3 and generally relating to available options for positioning and orienting of one or more of the light source(s) of the structure 100 as desired in terms of their illumination characteristics, for example, it shall be mentioned that a light source may be tilted, relative to a reference such as the top surface 108 of the arrangement or the original plane of the substrate film 102, by 3D shaping, optionally through thermoforming, the hosting substrate film 102 so as to establish at least a local 3D shape such as protrusion or recess at the location of the source, thus also tilting the source. Accordingly, emission direction(s) of the source may be adjusted in a desired way. For example, a top-shooting light source could be adjusted to hit or shoot further away on the surface 108A (e.g. an icon or other graphical/functional element 122 could be conveniently illuminated from side, whereas the volume directly below the illuminated feature may be optionally utilized for other purpose, e.g. electronics for sensing or other uses). A side-shooting light source could be additionally or alternatively adjusted to illuminate areas closer on top of it. Therefore, depending on the embodiment, tilting may also facilitate illumination of larger or smaller areas than otherwise being possible, and/or obtaining better uniformity to the surface illumination.

However, FIG. 3 illustrates, at 300, an alternative or supplementary solution. Here the circuit board 112 defines a tilted, optionally beveled, surface relative to the plane of the underlying substrate film 102, for hosting at least part of the circuitry 114 preferably including the at least one light source.

A carrier element 113 for the circuit board 112 has been disposed between the circuit board 112 and the substrate film 102, said carrier element 113 preferably comprising the beveled carrier surface 113B for the circuit board aligning the circuit board in a tilted position relative to the plane of the underlying substrate film. Alternatively, the carrier element 113 could be integrally formed or even monolithic with the circuit board 112. As indicated in FIG. 1, the circuit board 113 may optionally comprise at least one carrier element 113, which is not essentially a complex 3D shape with a tilted or beveled hosting surface, but e.g., a planar element instead.

The carrier surface 113B of the carrier element 113 may comprise a holder element, such as a protrusion or a hole, matching with a compatible counterpart, such as a hole or a protrusion shape respectively, of the circuit board.

Yet, the carrier element 113 may comprise electrically and/or thermally conductive material for providing electrical connections and/or thermal dissipation, for instance.

Indeed, the carrier element 113 may be utilized to cleverly orientate the light source/circuitry 114 and e.g. its emission direction(s), or sensing direction(s) in the case of sensor type circuitry 114, as desired and previously discussed. The carrier element 113 may comprise plastic material such as thermoplastics, metal, ceramics, etc. It may be (injection) molded or 3D printed, for example. The element(s) 113 may be manufactured for different tilting angles depending on the use case.

When hosting light sources, the tilted surface 113B may improve the size and uniformity of the obtained, more remote illumination area, but it may also be used for hosting sensors or various actuators, whereupon those sensors' or actuators' effective area may be improved. Illuminated area, outcoupling area, or effective area on the surface 108A may be shifted horizontally or laterally, e.g. from the area 118 directly above the light source 104 in connection with a top-emitting implementation to farther away 118B, or brought closer in connection with a side-shooting implementation, for example. Similar beneficial effects may be obtained by the 3D shaped substrate film 102 discussed earlier.

The carrier element 113 may contain flat side(s) and/or top for convenient assembly, such as pick and place surface mounting process, and/or for hosting additional elements, such as one or more electrodes (e.g., for a capacitive or other touch/gesture sensor) or other, optionally electronic, thermal, or optical, elements or components. Indeed, it may be beneficial e.g., for sensing purposes to utilize the top surface 113A of the element 113 as it is closer to the environment of the structure upon surface 108A. Accordingly, the top 113A of the carrier element 113 facing away from the substrate film 112 may define or host e.g. an electrically conductive sensing electrode optionally configured to capture gestures such as finger motion performed upon it.

Figure 4:
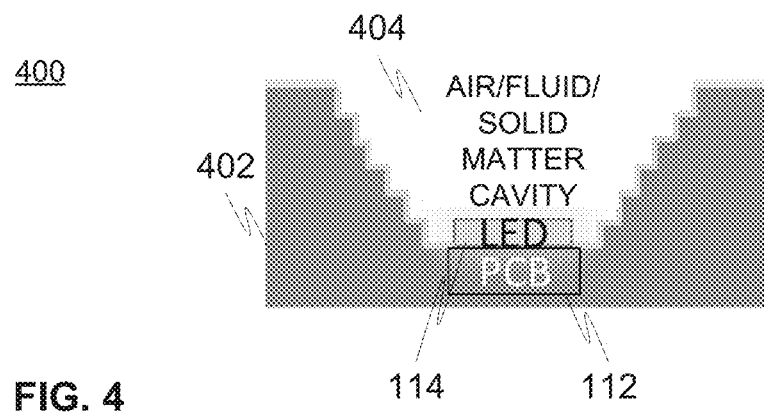
FIG. 4 illustrates an embodiment of a side wall structure for use e.g., with the lighting module and multilayer structure of the present invention.

FIG. 4 illustrates, at 400, an embodiment of a side wall structure suitable for use with the lighting module of the present invention.

Preferably as an integral part of the lighting module, an optionally plastic side wall structure 402 (please note a corresponding wall structure 902 in FIGS. 9-11) internally defining a cavity 404 around the at least one light source of circuitry 114 and preferably being laterally surrounded by the thermoplastic layer 108, may be provided. The structure 402 may be integral or in some cases even monolithic, at least partially, with the board 112. Yet, the structure 402 and board 112 may be attached to each other using eg. adhesive and/or mechanical fixing features such as screws or generally protrusion/recess type features.

The cavity 404 may comprise e.g., air, other fluid, or solid material, which is optically at least translucent, optionally transparent, to the selected emission wavelengths of the at least one light source, said air, other fluid or solid material being optionally trapped in the cavity depending on e.g., whether the cavity is closed (→trapped) or open at some end such as the top. Yet, the material may comprise luminescent material such as phosphor. In some embodiments, the refractive index of the material of the cavity 404 may be different from the one of adjacent materials, such as the one of e.g. a lens structure discussed in more detail relative to FIGS. 9-11, for example.

The side wall structure 402 may at least approximately define e.g., a cylindrical or truncated cone shape, but also other shapes are feasible.

Outer surface(s) of the structure 402 may have been treated at least selectively, such as roughened or provided with adhesive, for better adhesion to e.g. adjacent (injection) molded material, or for other potential uses.

The side wall structure 402 may be substantially opaque and/or reflective at least having regard to its surface areas facing the cavity 404, optionally diffusively, to at least selected wavelengths of the light emitted by the at least one light source of circuitry 114. For the purpose, the side wall structure 402 may optionally comprise a reflective coating (e.g. aluminium or silver), surface film, etc. In some embodiments, the used material may be luminescent. Accordingly, the structure 402 may, among other potential benefits, enhance light outcoupling and reduce light leakage considerably when adopted in the overall multilayer structure and in/upon the module 110.

The side wall structure 402 may substantially extend e.g., between the circuit board 112 and the opposite surface 108A of the thermoplastic layer 108 either fully or partially.

Figure 5:
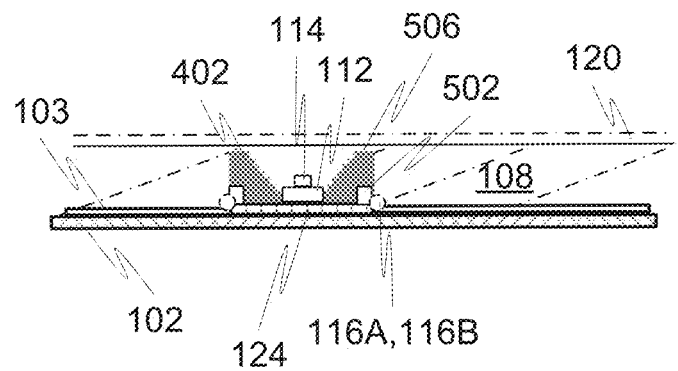
FIG. 5 is a sketch disclosing a side wall structure-containing module in connection with the multilayer structure.

FIG. 5 discloses a sketch, at 500, disclosing the side wall structure-containing module 110 in connection with and embedded in the multilayer structure. Item 502 refers to a number of contact pads that may electrically and/or thermally connect to the module and circuit board 112 thereof having the connection material(s) 116A, 116B in between.

In some embodiments, adhesive layer 506 may be provided on top of the side wall structure 402, e.g. between the side wall structure 402 and at least one cover element 120, 122 above.

Generally, a heat transfer element comprising thermally conductive and optionally electrically insulating material at least thermally connecting to the circuit board 112 and optionally extending through the substrate film via a hole 102a in the substrate film may be provided in the multilayer structures discussed herein for improved heat dissipation.

Figure 6:
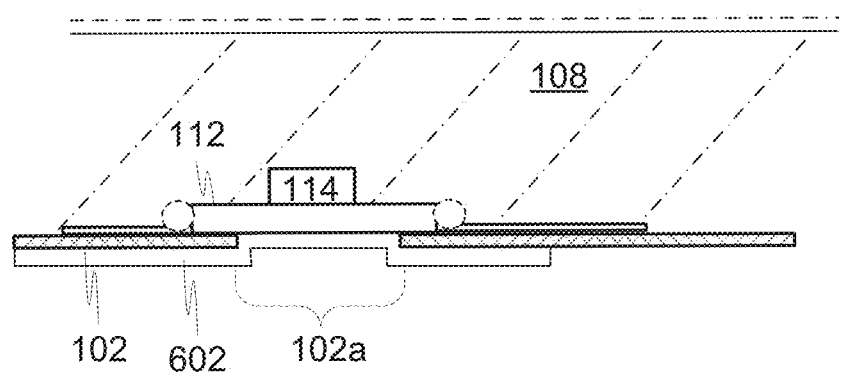
FIG. 6 illustrates an embodiment of a heat transfer element comprising a 3D-shaped sheet in connection the multilayer structure.

FIG. 6 illustrates, at 600, an embodiment of a heat transfer element comprising a 3D-shaped sheet 602 in connection with the multilayer structure. The sheet 602 may comprise e.g. graphene or other thermally conductive material. A graphene sheet could also include an electrically isolated layer providing a related shielding function.

Figure 7:
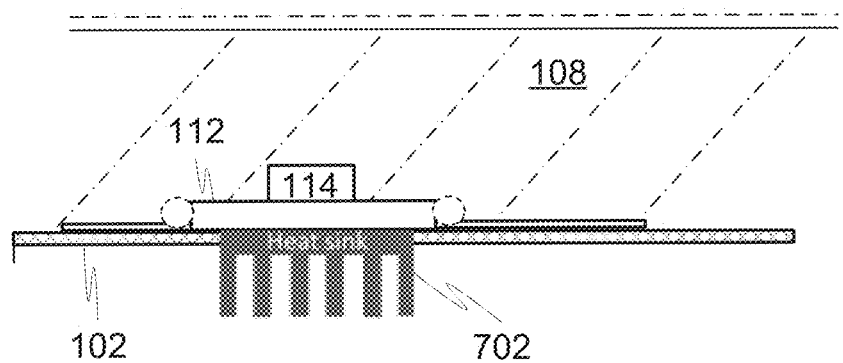
FIG. 7 illustrates a further embodiment of the heat transfer element comprising a heat sink in connection with the multilayer structure.

FIG. 7 illustrates, at 700, a further embodiment of the heat transfer element comprising a heat sink 702 in connection with the multilayer structure. The heat sink 702 may extend through the film 102. The heat sink 702 is naturally particularly useful when there is air convection present.

Figure 8:
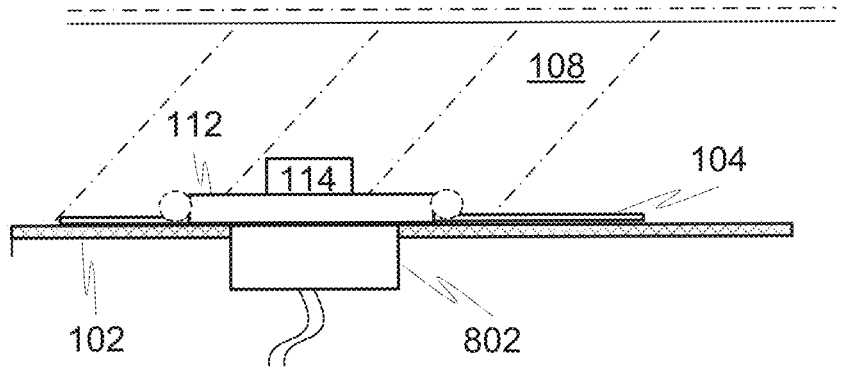
FIG. 8 illustrates a further embodiment of the heat transfer element comprising a connector in connection with the multilayer structure.

FIG. 8 illustrates, at 800, a further embodiment of the heat transfer element comprising a connector 802. Indeed a connector and e.g. wires connecting thereto may act as a heat sink in addition to other uses. The connector 802 may be further configured for mechanical, electrical and/or optical connectivity with an external device or host device, whereupon the connector 802 may include e.g., both electrically insulating and electrically conductive portions, such as an insulated body or housing, and conductive traces or pins, in addition to joint or separate thermally conductive portions.

Figure 9:
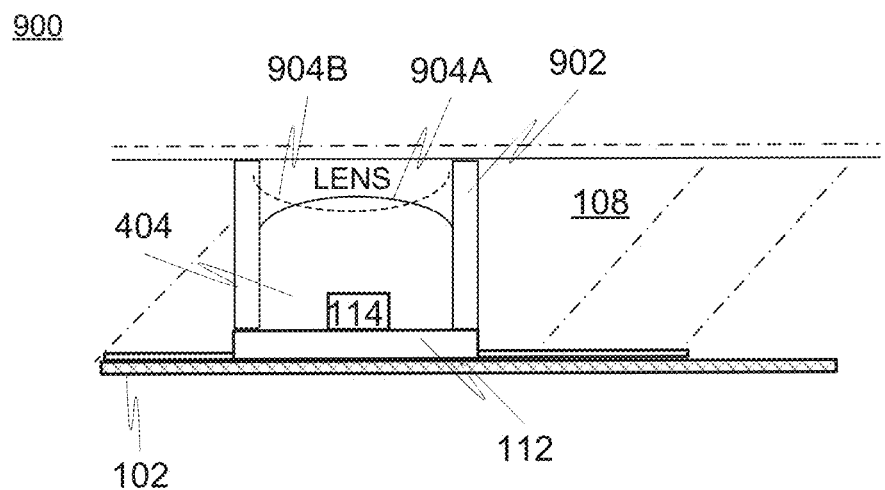
FIG. 9 illustrates an embodiment comprising a lens structure.
Figure 10:
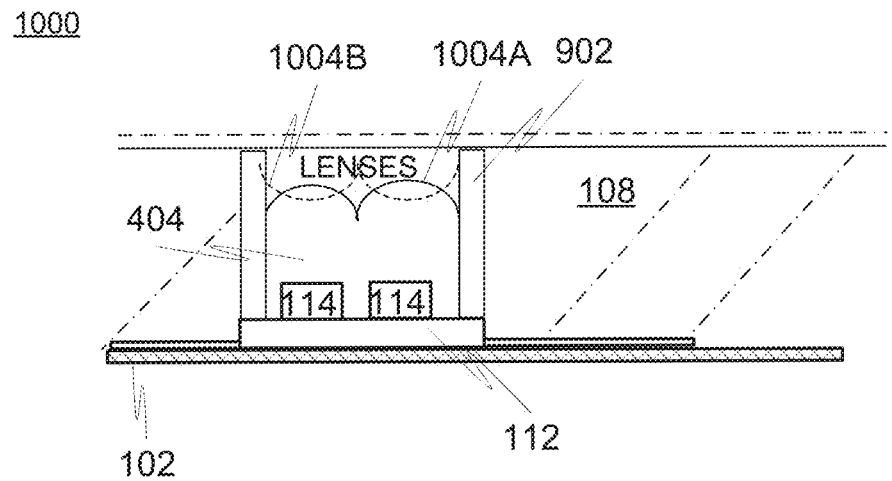
FIG. 10 illustrates a further embodiment comprising a lens structure, essentially a lens array.
Figure 11:
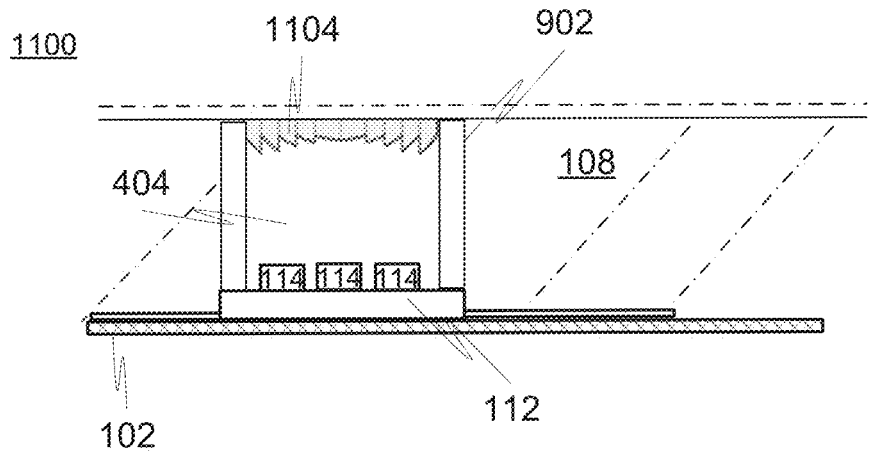
FIG. 11 illustrates a further embodiment comprising a Fresnel lens.

In various embodiments and with general reference to FIGS. 9-11, the multilayer structure may comprise a lens structure.

The lens structure may be a dedicated element or an integral part of the lighting module 110, or an integral part, further optionally monolithic, part of the thermoplastic layer 108 or e.g., a film 120 or other (cover) element thereon. The lens structure may still have additional elements thereon. It may not itself reach to the exterior surface of the hosting multilayer structure. Accordingly, the integrated, embedded lens structure may be visually and/or tactilely concealed from the environment when seen useful.

The lens structure may comprise one or more preferably mutually integral lenses, optionally a microlens array, preferably disposed along an optical path of the at least one light source included in the structure, e.g., in the circuitry 114. The lens structure is preferably connected to the side wall structure 902 that may be similar or different from the side wall structure 402 discussed hereinbefore. The walls may be optionally configured with light blocking such as optically reflective and/or diffusive surface.

Lens carrying or connecting side wall structure 902 may naturally in some embodiments be at least partially conveniently shared with other functionalities—having wall structure(s) such as the wall structure 402. The associated lenses may be plastic, for example.

The solution suggested herein cleverly harnesses the formability of e.g., a front/top film 120 or the thermoplastic layer 108 to create an integrated lens structure or array directly on a surface of the concerned part. The lens structure may be coated with a suitable coating to further adjust its optical properties, or to simply protect it from wear and environmental chemicals.

FIG. 9 illustrates, at 900, an embodiment comprising a lens structure with a concave 904A and/or convex 904B lens.

FIG. 10 illustrates, at 1000, a further embodiment comprising a lens structure, essentially a lens array of several lenses 1004A (concave) and/or 1004B (convex).

FIG. 11 illustrates, at 1100, a further embodiment comprising a Fresnel lens 1104.

The lenses may additionally or alternatively be of e.g. plano, meniscus, focusing, collimating, beamforming and/or diffusive nature.

Depending on the use scenario, a single lens or lens structure may be configured to process and transmit light from a single light source or a plurality of light sources. Light emitted by a single light source may, on the other hand, may be transmitted via one or several lenses or lens structures, as being also illustrated in the Figs. The light sources may include, for example, individual (smaller) LEDs, or specifically high-power LEDs, or a larger chip-on-board LED.

For example, the lens structure may be utilized to shape or alter (typically enhance) the illumination uniformity of the illuminated area 108A, 118, 118B or e.g. icon or other graphical element 122 thereon. Yet, the lenses may be generally utilized to control the light beam of the optically connected light source(s), such as width or uniformity thereof e.g., in spotlight type applications. Still, the lenses may be utilized to locally reinforce the multilayer structure, or particularly, the lighting module 110. The circuit board 114 may be configured to have a reflective surface for improved optical efficiency.

With e.g., microlens arrays prepared as discussed herein, various beamforming (light concentration or spreading, etc.) applications can be effectively carried out. Further, such microlens arrays may be used in light harvesting and sensor solutions to make the sensors more or less directional, naturally still depending on the exact application. In photonics and various other applications microlenses and also similar other lens structures contemplated herein may be used to make the overall solution less picky about the incident light angle, and therefore generally less picky about the position or positioning accuracy of different components such as light sources and lenses on the related optical paths.

Figure 13:
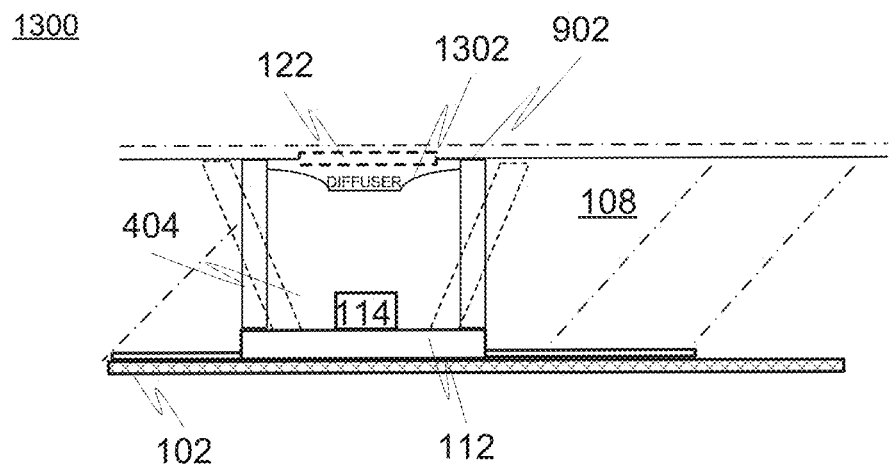
FIG. 13 illustrates an embodiment comprising a diffuser upon the lighting module.

FIG. 13 illustrates, at 1300, an embodiment comprising a diffuser in the multilayer structure, preferably positioned upon the lighting module 110. Indeed, as briefly addressed also hereinbefore, the multilayer structure may comprise, optionally as a dedicated (cover) element, or as an integral part of the lighting module 110, the thermoplastic layer 108 or e.g. a film 120 or other element 122 on the thermoplastic layer, a diffuser 1302. Manufacturing-wise the diffuser 1302 may have been printed or otherwise additively produced, molded, or lasered, milled or otherwise substractively produced. Various manufacturing options are discussed in further detail hereinafter.

For example, the item 122 may herein refer to a print such as an icon to be illuminated and potentially covering all or most of the outcoupling area 118, 118B, and/or the item 122 may refer to a surrounding or at least adjacent opaque print, coating or film blocking the light. A further film 120 may be additionally or alternatively provided on top for protection and/or other uses such as for implementing a further optical function. The film 120 may be clear/substantially transparent or colored with specular or diffuse transmission properties regarding the transmitted wavelengths. There may be cuts or holes in the film 120 or element 122 for enabling light transmission therethrough.

The diffuser 1302 may be utilized to provide more uniform illumination e.g., upon the target outcoupling area 118, 118B or generally surface 108A. The diffuser 1302 may thus prevent e.g. hot spots or dark spots occurring.

The diffuser 1302 may be of varying thickness. The diffuser 1302 may be provided and located on the optical path extending from the at least one light source of circuitry 114 to the environment of the structure via the outcoupling area 112 of the concerned light source. The diffuser 1302 may be optionally monolithic with the thermoplastic layer 108 and e.g. the (translucent) material of the lightguide layer 108. The diffuser 1302 may be additively produced on the layer 108, and/or subtractively produced from e.g., a layer 120, 122 upon the layer 108. A ready-made diffuser 1302 element or component included in the structure is a further option, optionally provided in connection with or integral with a larger module, such as module 110, comprising e.g. a light source, a carrier element, a circuit board and/or a related wall structure 902. In this respect, FIG. 13 illustrates, via broken lines, an example of alternative wall configuration, a bowl shape, from the right circular cylinder one. These different manufacturing and configuration options may also be selectively combined by a person skilled in the art to come up with a desired diffuser arrangement. Optionally, the diffuser 1302 may include or be adjacent an air cap or cavity filled with some other material such as diffusive material, as already discussed hereinbefore having regard to FIGS. 4 and 5.

The diffuser 1302 may be manufactured from e.g. diffusive plastic by (injection) molding, 3D printing or other additive method, or by CNC (Computer Numerical Control) milling or lasering, for instance. Using e.g., laser, the transparency and translucency of e.g., the thermoplastic layer 108 may be locally modified to implement the diffuser 1302 therefrom. On the other hand, the diffuser 1302 may be constructed from several stacked, optionally printed layers. Filtering characteristics of diffusive layer(s) of the diffuser 1302, which may optionally mutually differ, may be utilized to block e.g. selected colors/wavelengths. White, whitish or a single-color exhibiting diffuser 1302 if just not an essentially clear (non-color) diffuser 1302 could be used as a default solution for general applications, whereas a multi-color option may turn out useful e.g., in area diffusers 1302 with different areas associated with certain colors. Light blocks or black appearing areas may be further integrated with and implemented in the diffusers 1302. Therefore, the diffuser 1302 may also be used to block light from entering undesired areas e.g. on the surface 108A, which may reduce a need for additional blocking (opaque) prints.

Figure 14:
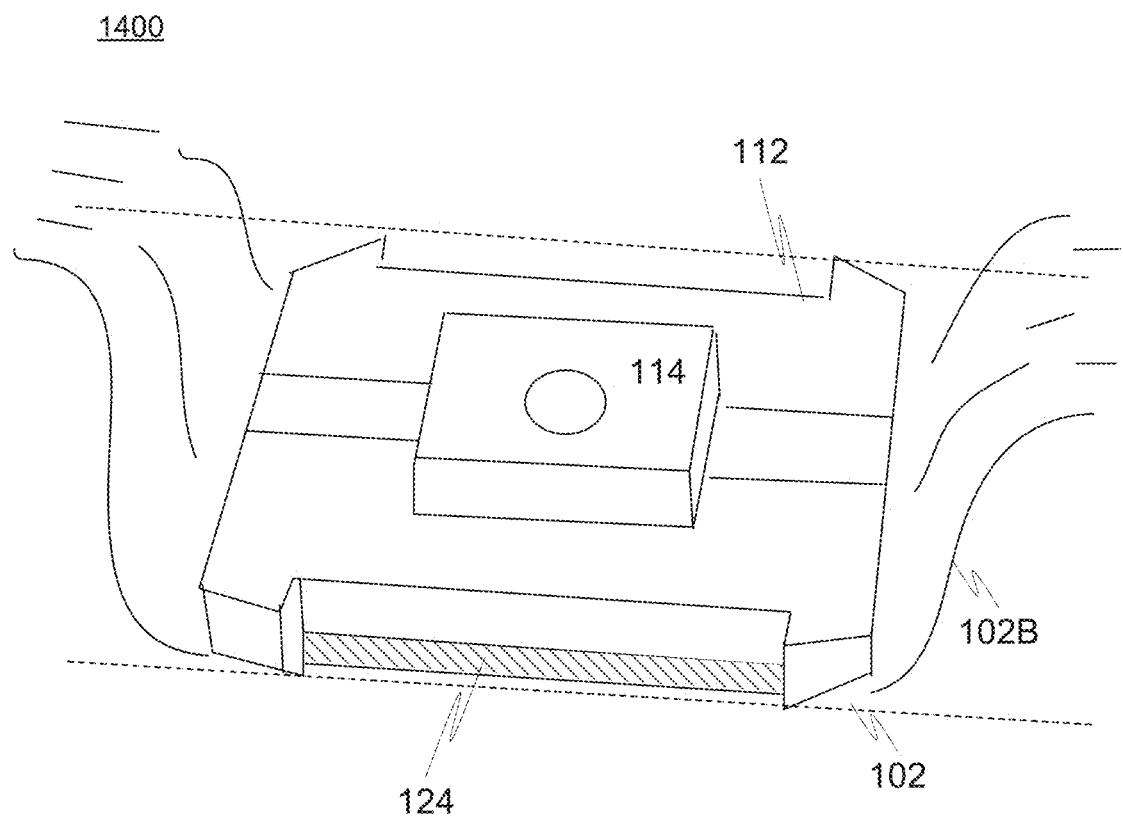
FIG. 14 illustrates a further embodiment of the lighting module.

FIG. 14 illustrates, at 1400, a further embodiment of the lighting module.

The substrate film 102, as discussed hereinelsewhere in more detail, may at least locally exhibit optionally thermoformed, essentially non-planar 3D shape, such as a curved, dome, recess, or protrusion shape. The circuit board 112 may be positioned in such a recess 102B of the substrate film of e.g. plastics or metal (e.g. sheet metal having insulation and conductive layers arranged therewith). Alternatively or additionally, the circuit board 112 could contain a recess for receiving circuitry 114 such as a light source therein. For example, conductive adhesive or zero ohm resistor may be applied for electrically and/or thermally connecting the circuitry 114 to the remaining circuit design/circuitry or e.g, heat transfer elements outside the module 110. Accordingly, light leakage may be minimized and the module 110 conveniently and reliably connected mechanically, electrically and/or thermally to the surrounding structure. In some embodiments, the recess 102B may have an optically reflective surface for light guiding purposes.

Figure 15:
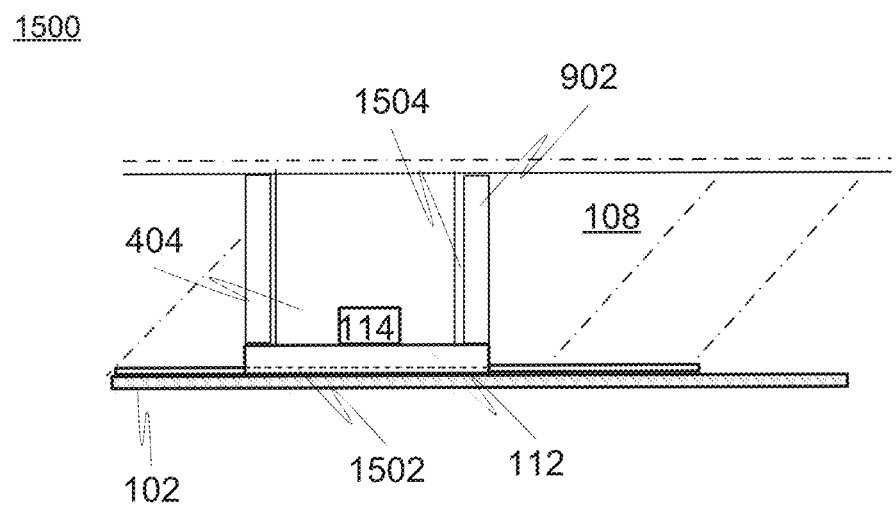
FIG. 15 illustrates a further embodiment of the multilayer structure and in particular, EMI shielding preferably provided in connection with the lighting module.

FIG. 15 illustrates, at 1500, a further embodiment of the multilayer structure and in particular, EMI shielding preferably provided in connection with the lighting module.

Selected or all elements such as one or more light sources and optionally e.g. related driver circuits of circuitry 114 of the module 110 may be at least partially enclosed, e.g. from the sides 1504 and/or bottom 1502, in an electrically and optionally thermally conductive shield structure for blocking the associated electromagnetic fields. Other elements to be shielded could include e.g. EMI disturbances—causing radio modules and components incorporating high frequency crystals. The associated preferred ground plane may be arranged into or onto the circuit board 112 (internal layer, exterior, etc.) and there may be a number of further electrically connected, grounded, electrically conductive and preferably also optically reflective transverse walls or wall material layers 1504 on the sides. Selected printing or plating processes may be used to establish the necessary electrically conductive elements or layers, for instance, and/or ready-made elements may be utilized. The suggested type of an enclosure may be additionally or alternatively utilized to protect various EMI sensitive components.

As being clear based on the above, the discussed EMI shielding feature may be conveniently and flexibly combined with various other embodiments and features potentially also present in the implementation of the present invention, with reference to different optical features, considering e.g. diffusers or reflectors, and structural features, considering e.g. the side walls 402, 902, and module 110 in general.

Figure 12:
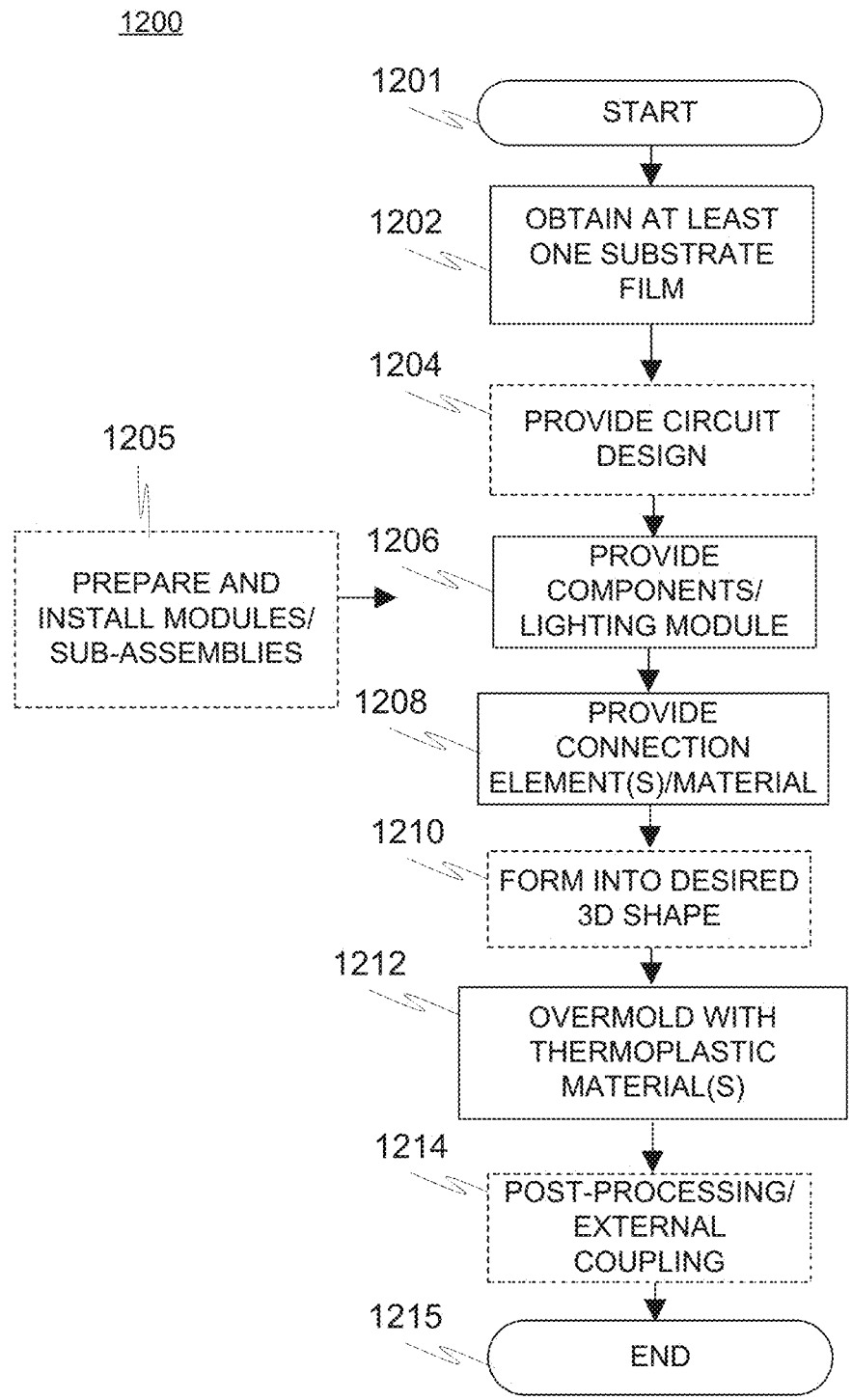
FIG. 12 is a flow diagram of an embodiment of a method in accordance with the present invention.

FIG. 12 shows, at 1200, a flow diagram of an embodiment of a method in accordance with the present invention.

At the beginning of the method for manufacturing the multilayer structure, a start-up phase 1201 may be executed. During start-up, the necessary tasks such as material, component and tools selection, acquisition, calibration and other configuration tasks may take place. Specific care must be taken that the individual elements and material selections work together and survive the selected manufacturing and installation process, which is naturally preferably checked up-front on the basis of the manufacturing process specifications and component data sheets, or by investigating and testing the produced prototypes, for example. The used equipment such as molding, IMD (in-mold decoration), lamination, bonding, (thermo)forming, electronics assembly, cutting, drilling, printing and/or measurement such as desired optical measurements—providing equipment, among others, may be thus ramped up to operational status at this stage.

At 1202, at least one, optionally flexible, substrate film of plastics or other material for accommodating e.g., electronics is obtained. The substrate film may initially be substantially planar or e.g. curved. The substrate film may at least dominantly be of electrically substantially insulating material(s). A ready-made element, e.g. a roll or sheet of plastic film, may be acquired for use as the substrate material. In some embodiments the substrate film itself may be first produced in-house by molding using a mold or molding device or other methods from selected starting material(s).

Optionally, the substrate film may be processed further at this stage. It may be, for example, provided with holes, notches, recesses, cuts, etc.

At 1204, a number of electrically and/or thermally conductive elements defining e.g. various conductor lines (traces), sensing elements such as electrodes, and/or contact areas such as pads to construct a circuit design are provided on one or more of the substrate film(s), either or both sides thereof, preferably by one or more additive techniques of e.g., printed electronics technology or 3D printing. For example, screen, inkjet, flexographic, gravure or offset lithographic printing may be applied by suitable printing device or devices. In some cases, also subtractive or semi-additive processes may be utilized. Further actions cultivating the substrate film(s) involving e.g. printing or generally provision of graphics, visual indicators, optical elements, etc. thereon may take place here.

In various embodiments the electrically and/or thermally conductive elements (traces, pads, connection elements, electrodes, etc.) may include at least one material selected from the group consisting of: conductive ink, conductive nanoparticle ink, copper, steel, iron, tin, aluminium, silver, gold, platinum, conductive adhesive, carbon fibre, graphene, alloy, silver alloy, zinc, brass, titanium, solder, and any component thereof. The used conductive materials may be optically opaque, translucent and/or transparent at desired wavelengths, such as at least portion of visible light, so as to mask or let the radiation such as visible light to be reflected therefrom, absorbed therein or let through, for instance. This aspect has also been discussed elsewhere herein. As practical examples of feasible conductive material, e.g. Dupont™ ME602 or ME603 conductive ink may be utilized.

At 1206 further circuitry such as one or more typically ready-made components including electronic components such as various SMDs may be attached to the contact areas on the film(s) e.g. by solder and/or adhesives. For example, light source(s) (e.g. LEDs) of selected technology and packaging may be provided here as well as e.g. different elements of control electronics, communication, sensing, connecting (e.g. connectors), hosting (circuit board(s), carrier(s), etc.) and/or power provision (e.g. battery) depending on the embodiment. A suitable pick-and-place or other mounting device may be utilized for the purpose, for instance. Alternatively or additionally, printed electronics technology may be applied to actually manufacture at least part of the components, such as OLEDs (organic LED), directly onto the film(s). Accordingly, the execution of items 1204, 1206 to provide the multilayer structure with desired circuitry may temporally overlap as being understood by a skilled person. Yet, the components prepared or installed herein may include various optical elements such as lenses, reflectors, diffusers, masks, filters, etc., or e.g., a carrier element with optionally tilted surface for accommodating a circuit board/lighting module.

Also various heat transfer elements discussed herein may be installed at this stage or afterwards, for example.

Selected elements may be subjected to further processing such as encapsulation.

Item 1205 specifically refers to preparation and attachment of one or more, at least partially pre-prepared, modules, such as the lighting module, or other 'sub-assemblies', which may incorporate an initially separate, secondary substrate such as a circuit board provided with a circuit design and electronics such as a number of light source(s), IC(s) and/or various other elements or components, such as optical or structural ones (e.g. wall structure, diffuser, lens, carrier elements, etc.), as being contemplated also hereinearlier in more detail.

At least part of the electronics and/or other elements of the final multilayer structure may be thus conveniently provided to the substrate film(s) via a fully or partially premanufactured module or sub-assembly. Optionally, the module or sub-assembly may be at least partially overmolded by a protective plastic layer prior to attachment to the main substrate.

For example, adhesive, pressure and/or heat may be used for mechanical bonding of the module or sub-assembly with the primary (host) substrate. Solder, wiring, and conductive ink are examples of applicable options for providing the electrical and/or thermal connections between the elements of the module or sub-assembly and with the remaining electrical and/or thermal elements on the main substrate. Item 1205 could also be executed e.g. upon item 1204 or 1208. The shown position is therefore primarily exemplary only.

Item 1208 refers to provision of connection material(s) such as inks or adhesives that electrically and thermally connect the circuitry of the (lighting) module to the remaining structure, such as the electrical traces, pads, thermal conductors, and/or heat transfer elements of the remaining structure. There may be a number of related connection points to receive the connection material(s) between the circuitry of the module and the remaining structure e.g. at the edges of the circuit board, with reference to e.g. castellations discussed hereinbefore. As discussed hereinbefore, single material such as many metals (silver, copper, gold, etc.) and alloys can be used for both purposes, whereas there are also many materials available that are at least dominantly either electrical or thermal conductors (e.g., diamond, boron arsenide, and various other thermally conductive insulators), not equally both. Accordingly, one or more materials may be provided herein as the connection material(s), and any single material may be utilized primarily or solely for electrical conduction, thermal conduction, or both. The same generally applies to providing electrical and/or thermal conductors also on the circuit board 110 and substrate film(s) 102, 120 during items 1204 and 1205. Suitable dispensing, printing or other tools or devices may be utilized for placing the connection material(s). Yet, as mentioned hereinbefore, in some embodiments a connection element established from the connection material(s) could be integrally formed with some other element.

Also at least some of the activities falling under item 1208 could be performed, depending on each particular embodiment in question, e.g., prior to or upon items 1205, 1206, whereupon process-wise location of item 1208 should not be considered strictly fixed to the illustrated one.

In some embodiments, prior to or upon the molding phase 1212, the substrate film(s) optionally already containing at least part of the circuit design, such as (printed) conductive elements, and further elements such as at least part of the electronic components, thermal conductor or heat transfer elements, a number of optical elements and/or discussed modules or sub-assemblies may be formed 1210 using thermoforming or cold forming, for instance, to exhibit a desired shape such as at least locally a three-dimensional (essentially non-planar) shape. Applicable former device such as a thermoformer may be naturally utilized for the purpose. Additionally or alternatively, at least some forming could take place after molding in case the already-established multilayer stack is designed to survive such processing. At least part of the required 3D forming of the substrate film may anyway take place already prior to providing an element, such as a lighting module, thereon, considering e.g., scenarios wherein the module is to be located in a formed recess, as discussed hereinbefore. Alternatively, the recess for hosting the module could in some embodiments be still formed subsequent to providing the module on the film.

Generally preferably though, the circuitry, module(s) and optionally further elements to be included in the multilayer structure are at least partially, if not fully, provided on the hosting film(s) prior to 3D-shaping of the film(s) (i.e., when the film(s) were still essentially planar or at least more planar) to avoid tedious 3D-assembly of electronics on already 3D-shaped carriers.

At 1212, at least one plastic layer, preferably a thermoplastic or in some embodiments optionally a thermoset layer, to act e.g., as a lightguide and a protective, securing layer upon the lighting module and possible further circuitry and elements to be embedded, is produced, preferably through molding such as injection molding, upon the substrate(s) so as to preferably at least partially embed the aforementioned. Desired portions may be left clear or cleared afterwards with mechanical or chemical processing, considering e.g., a cover portion of lighting module or other module intended to host replaceable or generally accessible (e.g. inspectable or reprogrammable) components. Such module may then also include a (re)movable cover part for providing access to the internals thereof.

The molded material(s) may be provided using several molding steps or shots, or via a single step, wherein the molded material may even optionally flow through a substrate film from one side thereof to the opposing side via a hole prepared therein or by penetrating through the substrate material itself (e.g. through a thinned/thinner portion), for example. The molding material(s) may be, and in many embodiments preferably are, at least dominantly electrically insulating.

In practice, at least one substrate film already provided with a number of features such as circuitry, module(s), optical features, etc. may be used as an insert in an injection molding process applying at least one molding machine. In case two films are used, both of them may be inserted in their own mold halves so that the plastic layer is injected at least between them. Alternatively, the second film could be attached to an aggregate of the first film and plastic layer afterwards by suitable lamination technique utilizing e.g., adhesive in between.

Some optical elements contemplated hereinbefore such as a lens structure or diffuser may be at least partially established during molding from the thermoplastic material and/or any of the film inserts by proper mold shapes.

Regarding the resulting overall thickness of the obtained stacked multilayer structure, the thickness depends e.g. on the used materials and related minimum material thicknesses providing the necessary strength in view of the manufacturing and subsequent use. These aspects have to be considered on case-by-case basis. For example, the overall thickness of the structure could be in the order of magnitude of about some millimeters as discussed hereinelsewhere, but considerably thicker or thinner embodiments are also feasible.

Item 1214 refers to a number of potential additional tasks such as post-processing and installation tasks. Further layers or generally features, may be added into the multilayer structure by molding, lamination or suitable coating (e.g. deposition) procedure, not forgetting other possible positioning or fixing techniques. The layers may be of protective, indicative and/or aesthetic value (graphics, colors, figures, text, numeric data, etc.) and contain e.g. textile, leather or rubber materials instead of or in addition to (further) plastics.

Additional elements such as electronics, modules, module internals or parts, and/or optics may be installed and fixed e.g. at the outer surface(s) of the structure, such as the exterior surface of an included film or a molded layer depending on the embodiment. For example, optical features such as a lens structure or a diffuser could be constructed or finalized here by processing the thermoplastic layer or any further layer or element thereon by adding material thereon or removing material therefrom (lasering is one option).

Also the aforediscussed hole 102a could be established in the substrate film 102 in favor of thermal dissipation by laser or other cutting means, and subsequently, a heat transfer element could be connected to the circuit board 112 therethrough. Alternatively, the hole 102a could be arranged earlier in the process, upon provision of the circuit board 112, for example. Necessary elements and material shaping/cutting/addition/removal may thus take place for different purposes.

If provided with a connector, the connector of the multilayer structure may be connected to a desired external connecting element such as an external connector of an external device, system or structure, e.g. a host device. For example, these two connectors may together form a plug-and-socket type connection and interface. The multilayer structure may also be generally positioned and attached herein to a larger ensemble such as an electronic host device, optionally a personal communications device, computer, household apparatus, industrial device, or e.g. a vehicle in embodiments wherein the multilayer structure establishes a part of vehicle exterior or interior, such as a dashboard or a panel.

At 1215, method execution is ended.

The scope of the present invention is determined by the attached claims together with the equivalents thereof. A person skilled in the art will appreciate the fact that the disclosed embodiments were constructed for illustrative purposes only, and other arrangements applying many of the above principles could be readily prepared to best suit each potential use scenario.

The invention claimed is:

1. An integrated functional multilayer structure comprising:
    a flexible substrate film comprising at least a number of electrical conductors;
    a lighting module provided upon the flexible substrate film, said lighting module comprising:
        a circuit board for hosting electronics; and
        circuitry arranged on the circuit board, the circuitry comprising at least one light source and/or at least one other electronic component;
    a 3D-shaped sheet comprising thermally conductive sheet material at least thermally connecting to the circuit board, wherein the 3D-shaped sheet extends by its 3D-shape through the substrate film via a hole in the flexible substrate film;
    a thermoplastic layer comprising one or more thermoplastic materials molded upon the flexible substrate film and at least laterally surrounding the lighting module;
    wherein the circuitry on the circuit board of the lighting module is configured to electrically and thermally connect to a number of locations of the remaining multilayer structure beside or underneath the circuit board utilizing at least one connection material.

2. The structure of claim 1, wherein the at least one connection material comprises at least one material selected from the group consisting of:
    electrically and thermally conductive material;
    thermally conductive electrically insulating material; and
    electrically conductive thermally insulating material.

3. The structure of claim 1, wherein the 3D-shaped sheet comprises electrically insulating material.

4. The structure of claim 1, wherein the 3D-shaped sheet comprises graphene.

5. The structure of claim 1, wherein the connection material, circuit board and/or the 3D-shaped sheet connected to the circuit board at least locally has a thermal conductance of at least about 1 W/mK.

6. The structure of claim 1, wherein the thermoplastic layer comprises optically at least translucent material.

7. The structure of claim 1, wherein the circuit board defines a tilted surface relative to the plane of the underlying substrate film for hosting at least part of the circuitry.

8. The structure of claim 1, comprising a carrier element for the circuit board disposed between the circuit board and the flexible substrate film, said carrier element comprising a beveled carrier surface for the circuit board aligning the circuit board in a tilted position relative to the plane of the underlying flexible substrate film.

9. The structure of claim 8, wherein the carrier beveled surface of the carrier element comprises a holder element matching with a compatible counterpart of the circuit board.

10. The structure of claim 8, wherein the carrier element comprises electrically and/or thermally conductive material.

11. The structure of claim 10, wherein the top of the carrier element facing away from the flexible substrate film defines an electrically conductive sensing electrode.

12. The structure of claim 1, comprising a side wall structure internally defining a cavity around the at least one light source and being laterally surrounded by the thermoplastic layer, said cavity comprising air, other fluid, or solid material, which is optically at least translucent to the selected emission wavelengths of the at least one light source.

13. The structure of claim 12, wherein the side wall structure is substantially opaque to at least selected wavelengths of the light emitted by the at least one light source.

14. The structure of claim 12, wherein the side wall structure substantially extends between the circuit board and the opposite surface of the thermoplastic layer.

15. The structure of claim 1, comprising at least one cover element on a side of the thermoplastic layer opposite to the side facing the circuit board.

16. The structure of claim 15, comprising:
    a side wall structure internally defining a cavity around the at least one light source and being surrounded by the thermoplastic layer, said cavity comprising air, other fluid, or solid material, which is optically at least translucent to the selected emission wavelengths of the at least one light source; and
    an adhesive layer between the side wall structure and the at least one cover element.

17. The structure of claim 1, comprising a lens structure including one or more lenses disposed along an optical path of the at least one light source.

18. The structure of claim 1, comprising a diffuser associated with at least one of the lighting module or the thermoplastic layer.

19. The structure of claim 1, comprising an electromagnetic interference shielding structure of electrically conductive material at least partially surrounding one or more elements of the circuitry.

20. The structure of claim 1, comprising at least one other element selected from the group consisting of: series resistor, thermistor, white solder mask, capacitor, inductor, trace, antenna, sensor, electrode, contact pad, integrated circuit, controller, processor, memory, transceiver, driver circuit, and via.

21. The structure of claim 1, wherein the circuit board comprises a number of castellations.

22. The structure of claim 1, where the at least one connection material defines an angular or curved element directed over an edge of the circuit board.

23. The structure of claim 1, wherein the flexible substrate film at least locally exhibits an essentially non-planar 3D shape.

24. The structure of claim 1, comprising structural adhesive between the substrate film and the circuit board.

25. The structure of claim 1, wherein the at least one light source comprises a packaged semiconductor type or a chip-on-board semiconductor type light source.

26. The structure of claim 1, wherein the circuit board comprises at least one element selected from the group consisting of: flexible film or sheet, rigid sheet, rectangular sheet or film, rounded or essentially circular sheet or film, FR4 based circuit board, metal core circuit board, plastic substrate, molded plastic substrate, metal substrate, and ceramic circuit board.

27. The structure of claim 1, wherein the flexible substrate film comprises at least one material selected from the group consisting of: polymer, thermoplastic material, electrically insulating material, PMMA (Polymethyl methacrylate), Poly Carbonate (PC), copolyester, copolyester resin, polyimide, a copolymer of Methyl Methacrylate and Styrene (MS resin), glass, Polyethylene Terephthalate (PET), carbon fiber, organic material, biomaterial, leather, wood, textile, fabric, metal, organic natural material, solid wood, veneer, plywood, bark, tree bark, birch bark, cork, natural leather, natural textile or fabric material, naturally grown material, cotton, wool, linen, silk, and any combination of the above.

28. The structure of claim 1, wherein the thermoplastic layer comprises at least one thermoplastic material selected from the group consisting of: polymer, organic material, biomaterial, composite material, thermoplastic material, thermosetting material, elastomeric resin, PC, PMMA, ABS, PET, copolyester, copolyester resin, nylon (PA, polyamide), PP (polypropylene), TPU (thermoplastic polyurethane), polystyrene (GPPS), TPSiV (thermoplastic silicone vulcanizate), and MS resin.

29. The structure of claim 1, wherein the at least one light source is a high-power component having a wattage of 1 W or more of electric power during use thereof.

30. A method for manufacturing an integrated functional multilayer structure, comprising:
 providing a flexible substrate film with a circuit design comprising at least a number of electrical conductors;
 arranging a lighting module upon the flexible substrate film, said lighting module comprising:
  a circuit board for hosting electronics; and
  circuitry on the circuit board and comprising at least one light source and/or at least one other high-power electronic component;
 wherein the circuitry is configured to electrically and thermally connect to a number of locations of the remaining structure beside or underneath the circuit board utilizing at least one connection material;
 arranging a 3D-shaped sheet comprising thermally conductive sheet material to at least thermally connect to the circuit board, wherein the 3D-shaped sheet extends by its 3D-shape through the flexible substrate film via a hole in the substrate film; and
 producing a thermoplastic layer on the flexible substrate film to at least laterally surround the lighting module.

* * * * *